BLOCKING OSCILLATOR COMPRISING CASCADED TRANSISTOR PAIR WITH IMPEDANCE MEANS TO CONTROL OUTPUT PULSE WIDTH

Filed Jan. 29, 1962 2 Sheets-Sheet 1

INVENTOR.
JAMES C. DAVIDSON
BY
Christie, Parker & Hale
ATTORNEYS.

Dec. 24, 1963 J. C. DAVIDSON 3,115,587
BLOCKING OSCILLATOR COMPRISING CASCADED TRANSISTOR PAIR
WITH IMPEDANCE MEANS TO CONTROL OUTPUT PULSE WIDTH
Filed Jan. 29, 1962 2 Sheets-Sheet 2

INVENTOR.
JAMES C. DAVIDSON
BY
Christie, Parker & Hale
ATTORNEYS.

3,115,587
Patented Dec. 24, 1963

3,115,587

BLOCKING OSCILLATOR COMPRISING CASCADED TRANSISTOR PAIR WITH IMPEDANCE MEANS TO CONTROL OUTPUT PULSE WIDTH

James C. Davidson, Glendora, Calif., assignor to Burroughs Corporation, Detroit, Mich., a corporation of Michigan Filed Jan. 29, 1962, Ser. No. 169,370
5 Claims. (Cl. 307—88.5)

This invention relates to blocking oscillators.

Blocking oscillators have been used in the past to generate pulse signals of varying pulse widths. When the blocking oscillator employs transistors the pulse widths have largely been dependent upon the gain of the transistor. Even when the same type of transistor is employed in a blocking oscillator, the gain for each of the same type of transistor may be different and, therefore, the pulse widths derived from blocking oscillators of the same circuit configuration may vary. It is desirable to provide a transistor blocking oscillator in which the pulse widths are controlled by means of the circuit parameters and is independent of the transistor gain and the variations in gain from transistor to transistor.

The present invention provides an improved transistor blocking oscillator that allows a wide variation of pulse widths to be derived from the oscillator and yet provides reliable generation of pulses having a preselected width. The blocking oscillator comprises a pair of transistors arranged in a cascade-like fashion whereby the output current from one of the transistors controls the input current of the other transistor. The output current of the triggered first transistor is effective to render the second transistor conductive. This second transistor's output current will increase at a constant rate, until the input and output currents thereof are equal, due to the constant voltage applied to the transformer. Therefore, by controlling the output current of the first transistor, the length of time that the second transistor is conducting and thereby the generated pulse width may be controlled. In addition to generating the output pulses, the output current from the second transistor is utilized to drive the first transistor to maintain the conductive state thereof until the input and output currents of the second transistor are equal, at which point in time the first transistor is immediately cut off to thereby terminate the output pulse. In a preferred arrangement, the output circuit of the blocking oscillator includes a further circuit to give a constant load characteristic for the blocking oscillator to better define the pulse width.

These and other features of the present invention may be more fully appreciated when considered in the light of the following specification and drawings, in which.

Figures 1, 3:
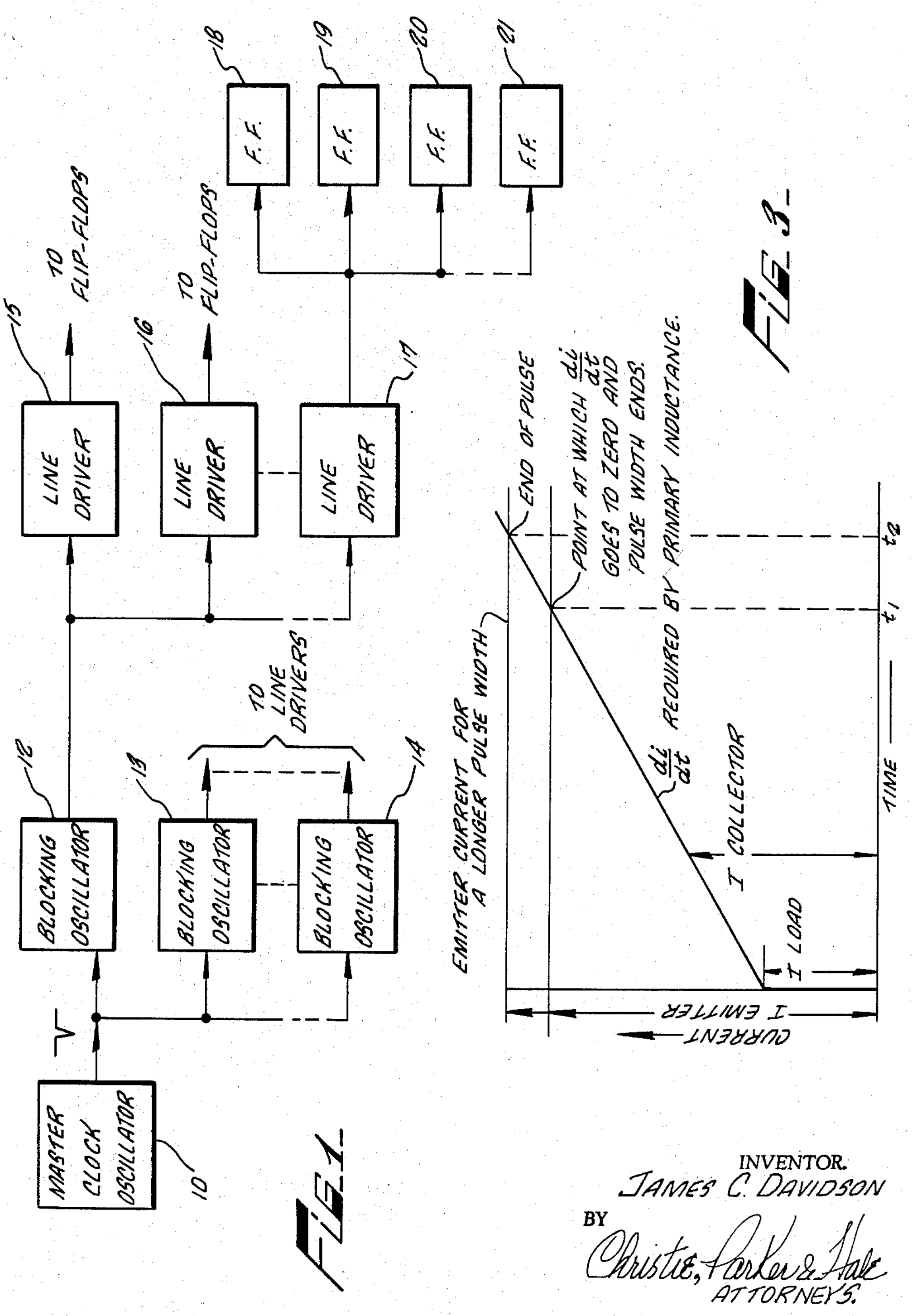
FIGURE 1 is a block diagram of a typical clock pulse generating system for a computer and embodying the present invention.
FIGURE 3 is a graphical illustration of the current versus time relationship for defining the pulse widths of the pulses derived from the blocking oscillator of FIG. 2.

In a typical clock pulse generating arrangement for a digital computer as exemplified by FIG. 1, it is necessary to provide clock pulses to a plurality of bistable elements or flip-flops spread over a large physical area. It is important that the clock pulses derived from the master clock oscillator be accurately defined as to their pulse widths to assure proper operation of these flip-flops. With the flip-flops arranged over a large physical area and utilizing a single master clock oscillator, the pulses delivered to these widely distributed flip-flops deteriorate due to these large distances and, in addition, the differences in distances from the master clock oscillator result in pulses of different characteristics. It is possible to control the clock pulse widths by providing a plurality of master clock oscillators arranged locally with respect to the bistable elements, however, it is more economical to limit the master clock oscillator to a single oscillator and provide some means for accurately controlling and defining the pulses delivered to these widely distributed flip-flops. Such an arrangement is exemplified by the block diagram of FIG. 1.

Figure 2:
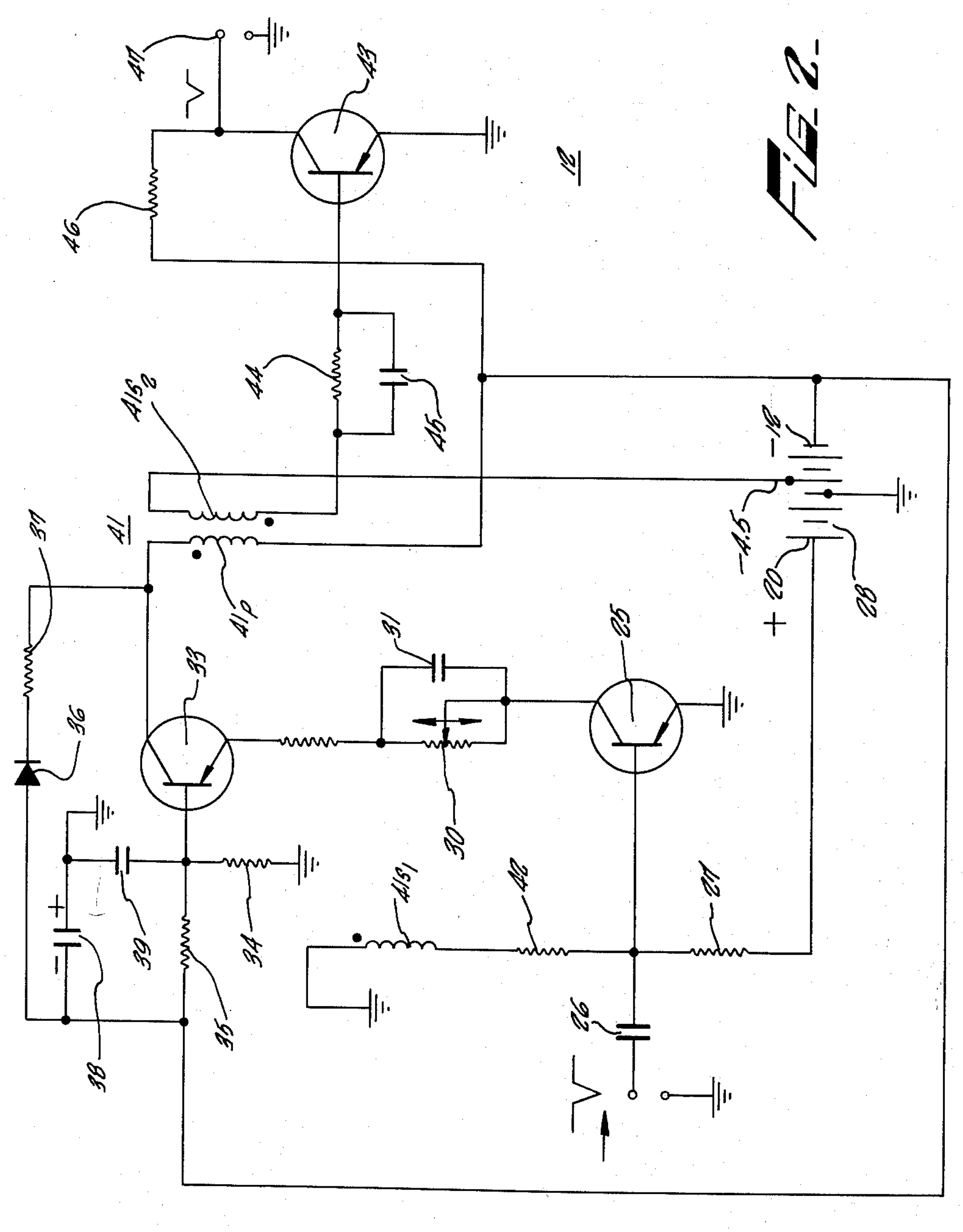
FIGURE 2 is a schematic circuit diagram of the blocking oscillator embodying the invention.

The master clock oscillator 10 is shown providing a negative pulse signal to a plurality of blocking oscillators 12, 13, and 14 arranged in a parallel circuit fashion therewith. The output pulses derived from each blocking oscillator 12, 13, and 14 may, in turn, be coupled to a plurality of line driving circuits, similar to the line drivers 15, 16, and 17 shown coupled to the blocking oscillator 12. These line drivers 15–17 are responsive to the output pulses from the blocking oscillator 12 and after suitable amplification these pulses are each in turn coupled to a plurality of flip-flops distributed in the computer system proper. The flip-flops 18, 19, 20, and 21 are shown coupled to the line driver 17, and similar flip-flop arrangements are utilized with the other line drivers (not shown). In this arrangement then it is evident that the pulses derived from the blocking oscillators 12, 13, and 14 must be accurately defined and, in particular, with regard to their pulse width for operating the associated flip-flops. A blocking oscillator of this type is shown in FIG. 2 and generally identified by the reference character 12. It will be recognized that the blocking oscillators 13 and 14 are of identical construction and only the single blocking oscillator 12 need be described.

The negative input pulses to the blocking oscillator 12 from the master clock oscillator 10 are applied to the input circuit for a transistor 25 or, more specifically, in the base-emitter circuit therefor by means of a coupling capacitor 26. The emitter electrode of the transistor 25 is coupled directly to ground or a point of reference potential and the base electrode is provided with a dropping resistor 27 connected thereto and a positive supply voltage, shown as the positive terminal of a battery 28; plus 20 volts. The output circuit for the transistor 25 is shown with the collector electrode of this transistor connected to a variable resistance 30 provided with a bypass capacitor 31 coupled in parallel circuit therewith and which combination is connected in series circuit relationship with a dropping resistor 32 connected directly to the input circuit, specifically the emitter electrode, for a second transistor 33. The base electrode for the transistor 33 includes a base dropping resistor 34 connected thereto and to a point of reference potential. In addition, a further dropping resistor 35 is connected to this same base electrode and to a negative potential shown as the minus 12 volt terminal for the battery 28. The output circuit for the transistor 33 includes a series arrangement with the collector electrode of the diode 36 and dropping resistor 37 connected to the minus 12 volt terminal of the battery 28. The capacitor 38 is connected between the point of reference potential and battery end of the resistor 35 to filter the supply source, in this instance the battery 28. The capacitor 39 is connected to the opposite end of the same resistor or to the base electrode of transistor 33 and to a point of reference potential to bypass the base electrode to ground. The output circuit for the transistor 33 further includes a transformer 41 having its primary winding 41p connected in series circuit relationship with the collector electrode and the minus 12 volt terminal of the battery 28. A secondary winding $41s_1$ is also provided for the transformer 41 and is connected between a point of reference potential and to the input circuit for the transistor 25 by means of a circuit connection to the base electrode through a series dropping resistor 42. A further secondary winding or pulse output winding $41s_2$ is provided for the transformer 41 and is connected between a point of negative potential, shown as a minus 4.5 volts on the battery 28, and the input circuit for an output transistor 43.

The transistor 43 has its input circuit defined to include a grounded emitter electrode and a serial base resistor 44 having a bypass capacitor 45. The output circuit for this transistor 43 is shown with a dropping resistor 46 connected to the collector electrode and to the negative terminal of the battery 28. The output pulses from the blocking oscillator proper, or from the winding $41s_2$, are derived between the output terminals defined by connections to the collector electrode for the transistor 43, further identified by the reference character 47, and ground, as illustrated.

The circuit parameters as described hereinabove are arranged to maintain the transistors 25 and 33 in a normally nonconductive condition and the transistor 43 in a normally conductive condition. Upon the arrival of a negative triggering pulse from the master clock oscillator 10 to the input circuit of the blocking oscillator 12 by means of the capacitor 26, it changes the voltage conditions at the input circuit for the transistor 25 and renders it conductive. The amount of output current derived from the transistor 25 is principally controlled by the value of the resistance 30 or the setting selected for this variable resistance. This output current from the transistor 25 is directly coupled to the input circuit for the transistor 33 and causes this transistor to become conductive. With reference to FIG. 3, it will be noted that at this instant the collector current of the transistor 33 will jump from no current to a current corresponding to the load on the transistor 33, as illustrated. The output or collector current from the transistor 33 will attempt to follow or increase towards this input or emitter current and, therefore, will steadily increase in a linear fashion as illustrated by the graph of FIG. 3, that is, the rate of change ($di/dt$) of the collector current is a constant. The linear increase in output current or in collector current from the transistor 33 is a result of operating the transformer 41 on its magnetic saturation curve whereby the inductance of the transformer is linear.

It should be recognized that operating the transformer in this fashion, the primary inductance of the winding $41p$ requires a constant voltage to be applied thereto. In order to maintain this constant voltage, the transistor 33 must be held in a saturated conductive condition, and this saturated condition is achieved through the linear rate of change of current, $di/dt$, as is noted in FIG. 3.

During the interval that the current through the winding $41p$ is increasing, a voltage is developed in the secondary winding $41s_1$ arranged in the input circuit to the transistor 25 for driving this transistor and is effective to maintain it in its conductive condition. The drive afforded by means of the secondary winding $41s_1$ is greater than required so as to eliminate the influence of the gain of the transistor upon operation of the blocking oscillator 12 and particularly limiting the desired action of the transistor 33. At the instant of time when the emitter and collector currents for the transistor 33 are equal, as shown in FIG. 3, the rate of change ($di/dt$) of the current through the primary winding $41p$ becomes zero and, therefore, the voltage developed in winding $41s_1$ becomes zero and thereby the drive to the transistor 25 is immediately cut off and which action, in turn, terminates the output pulse from the secondary winding $41s_2$.

As was indicated hereinabove, the interval that the transistors 25 and 33 are conducting is governed by the time required for the input and output currents for the transistor 33 to become equal and the input current is, in turn, controlled by the resistance value selected for the resistor 30. The pulse widthe of the pulses derived from the secondary winding $41s_2$, therefore, may be controlled by varying the resistance value of the resistor 30 and the same mechanism for rendering the transistor 25 nonconductive for each value of resistance 30 applies. This is made more evident by the graphical illustration of FIG. 3 wherein pulse widths corresponding to two settings of the resistor 30 are shown and identified as pulses having time durations represented by $t1$ and $t2$.

It will be recognized that with the transistor 43 normally conducting, that the application of the pulse thereto by means of the secondary winding $41s_2$ renders it nonconductive for the pulse interval. This action places the collector electrode of the transistor 43 at a negative potential to provide the desired negative output signal.

A further aspect of the invention is the combination of the transistor 43 and its function in connection with the blocking oscillator circuitry proper. As was indicated hereinabove, upon the triggering of the transistor 25 the transistor 33, in turn, is rendered conductive and jumps from a nonconductive condition to an output current or a load current corresponding to the load on the transistor 33. If the load current is a significant portion of the collector current of the transistor 33, it has been found that in order to maintain the desired pulse widths it is desirable that the load on the transistor 33 be fixed so that the initial load current, upon triggering the transistor 25, will be the same. The circuit parameters associated with the transistor 43 have been selected to provide a constant load characteristic for the blocking oscillator to cause the load current to start at essentially the same point with each cycle of the blocking oscillator. It should be evident that with variable loads the initial load current will vary about the desired load point and that with the varying initial load conditions the point in time at which the input and output currents for the transistor 33 become equal will vary and, therefore, cause a variation in the output pulse width.

It will be understood that circuit specifications for the blocking oscillator of the present invention as shown in FIG. 2 may vary according to the design for any particular application. The following circuit specifications are included by way of example only.

| | |
|---|---|
| Transistors 25 and 43 | 2N782. |
| Transistor 33 | 2N1204. |
| Capacitor 26 | 50 microfarads. |
| Resistor 27 | 19,600 ohms. |
| Resistor 42 | 1,000 ohms. |
| Resistor 30 | 200 ohms (variable). |
| Capacitor 31 | 220 microfarads. |
| Resistor 32 | 46,400 ohms. |
| Resistor 34 | 464 ohms. |
| Resistor 35 | 750 ohms. |
| Resistor 37 | 133 ohms. |
| Capacitor 38 | 50 microfarads. |
| Capacitor 39 | .02 microfarad. |
| Resistor 44 | 2,370 ohms. |
| Capacitor 45 | 50 microfarads. |
| Resistor 46 | 316 ohms. |
| Diode 36 | Clevite Transistor Products No. 309. |
| Transformer 41 [1] | 20 microhenries. |

[1] Transformer 41 has a 1:1:1 primary to secondary ratio.

What is claimed is:

1. A blocking oscillator including a first switching device having an input, output, and control electrode normally arranged in a nonconductive condition, means coupled between the input-control electrode circuit of said switching device for delivering electrical pulses thereto to momentarily place the device in a conductive condition, impedance means connected to the output electrode of said device for controlling the output current thereof, a second switching device having an input, output, and control electrode normally arranged in a nonconductive condition, the input-control electrode circuit of said second switching device being connected to said impedance means whereby the output current of said first switching device switches the second device into a conductive condition governed by said output current and the output current of said second switching device is defined to linearly increase with time until the interval the input and output currents of the second switching device are substantially the same, circuit means including transformer means having a primary winding coupled to the output electrode of said second switching device, a secondary winding for said transformer means coupled to the control-input electrode circuit of said first switching device for maintaining it in a conductive condition during the interval the output current of said first switching device is increasing, and further secondary winding means coupled to said transformer means for deriving output pulses therefrom having a preselected pulse width.

2. A blocking oscillator comprising a first transistor having an input, output, and control electrode, said input electrode being connected to a point of reference potential, impedance means coupled to the output electrode for controlling the output current of said transistor, means coupled between the control electrode and the input electrode for delivering electrical signals thereto, a second transistor having an input, output, and control electrode, the input electrode of said second transistor being connected to the opposite terminal of said impedance means from the output electrode of said first transistor, impedance means connected between said control electrode of said second transistor and a point of reference potential, circuit means including transformer means having a primary winding coupled to the output electrode of said second transistor, said transformer means including a secondary winding connected between the control and input electrodes of the first transistor, a further secondary winding for the transformer, and circuit means coupled to said further secondary winding for providing a constant load characteristic to said second transistor.

3. A blocking oscillator as defined in claim 2 wherein said transformer means functions as a linear transformer and the width of the output pulses derived from said further secondary winding being determined by the time interval required for the output current of said second transistor to equal the input current.

4. A blocking oscillator as defined in claim 3 wherein the first-mentioned impedance means includes a variable impedance device for controlling the output current of said first transistor and thereby the input current to said second transistor whereby the widths of said output pulses are governed.

5. A blocking oscillator for providing output pulses of a preselected pulse width including a first transistor having an input, output, and control electrode, means for connecting the input electrode to a point of reference potential, impedance means coupled to the control electrode and adapted to be connected to a source of potential for normally maintaining said transistor in a nonconductive condition, further means coupled to said input-control electrode circuit for delivering pulses thereto to render the transistor momentarily conductive, a second transistor having an input, output, and control electrode, impedance means including a variable resistive impedance means connected between the output electrode of said first transistor and the input electrode of said second transistor, impedance means connected to the control electrode of said second transistor and adapted to be connected to a source of potential for normally maintaining said second transistor in a nonconductive condition, output circuit means including primary transformer winding means connected to the output electrode of said second transistor and adapted to be connected to the source of potential, the circuit arrangement of the second transistor being such that the conduction of said first transistor renders the second transistor conductive, secondary transformer winding means connected to the input-control electrode circuit of said first transistor for maintaining the first transistor conductive until the input and output currents of said second transistor are substantially equal, and impedance means coupled to said winding means providing output pulses of a preselected time duration depending on the impedance of said variable resistive impedance means.

No references cited.